(12) United States Patent
Shin et al.

(10) Patent No.: US 7,189,460 B2
(45) Date of Patent: Mar. 13, 2007

(54) HIGH REFLECTANCE MIRROR

(75) Inventors: Naoko Shin, Yokohama (JP); Takuji Oyama, Yokohama (JP); Kazuo Kadowaki, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 10/875,270

(22) Filed: Jun. 25, 2004

(65) Prior Publication Data

US 2005/0008879 A1 Jan. 13, 2005

(30) Foreign Application Priority Data

Jun. 27, 2003 (JP) ............................. 2003-184718
Nov. 28, 2003 (JP) ............................. 2003-399390

(51) Int. Cl.
*B32B 9/00* (2006.01)

(52) U.S. Cl. ...................... 428/469; 428/446; 428/448; 428/457; 428/472.2

(58) Field of Classification Search ................ 428/426, 428/428, 432, 433, 434, 469, 472.2
See application file for complete search history.

(56) References Cited

U.S. PATENT DOCUMENTS

| | | | | |
|---|---|---|---|---|
| 4,337,990 A | * | 7/1982 | Fan et al. | 359/360 |
| 4,900,137 A | * | 2/1990 | Carter | 359/488 |
| 4,955,705 A | * | 9/1990 | Nakajima et al. | 359/884 |
| 5,215,832 A | * | 6/1993 | Hughes et al. | 428/623 |
| 5,245,453 A | * | 9/1993 | Hatano et al. | 349/27 |
| 6,565,217 B2 | * | 5/2003 | Laroche et al. | 359/838 |

FOREIGN PATENT DOCUMENTS

| | | | |
|---|---|---|---|
| JP | 02169244 A | * | 6/1990 |
| JP | 5-127004 | | 5/1993 |
| JP | 8-146208 | | 6/1996 |
| JP | 2000-81505 | | 3/2000 |
| JP | 2000-241612 | | 9/2000 |
| JP | 2001-74922 | | 3/2001 |
| JP | 2002-226927 | | 8/2002 |
| JP | 2003-4919 | | 1/2003 |

* cited by examiner

*Primary Examiner*—Jennifer McNeil
*Assistant Examiner*—Elizabeth D. Ivey
(74) *Attorney, Agent, or Firm*—Oblon, Spivak, McClelland, Maier & Neustadt, P.C.

(57) ABSTRACT

A high reflectance mirror having a high reflectance in a visible-light region, being excellent in durability such as a moisture resistance, a saltwater resistance, etc. and having small dependence on incident angle (i.e., the fluctuation of the reflectance depending on an incident angle of light is little) is provided.

The high reflectance mirror comprises a substrate and a silver film, a low refractive index film and a high refractive index film laminated on the substrate in this order wherein an adhesion improving film is formed on the silver film surface on the opposite side of the substrate, the extinction coefficient of the low refractive index film is at most 0.01, the extinction coefficient of the high refractive index film is at most 0.01, the adhesion improving film is an oxide film and the extinction coefficient of the adhesion improving film is at most 0.1.

6 Claims, 1 Drawing Sheet

Fig. 1

HIGH REFLECTANCE MIRROR

BACKGROUND OF THE INVENTION

1. Field of the Invention

The present invention relates to a reflection mirror having a high reflectance (hereinbelow, referred to as a high reflectance mirror) used mainly for a reflection mirror in a rear-projection television or a backlight module for a small-sized liquid crystal display for a cellular phone etc.

2. Discussion of Background

As reflection mirrors used for electronic appliances such as flat panel displays etc., there have widely been used mirrors in which a metal film is utilized for reflection. For purposes of improving the luminance of an electronic appliance and energy saving, it is important to increase the reflectance of the reflection mirror. For instance, in a liquid crystal display used for a cellular phone etc., a mirror for reflecting the backlight is used. In such mirror, a film is used as the substrate to reduce the weight, and on the other hand, there is a demand of providing the reflection mirror having a high reflectance. Further, a plurality of reflection mirrors are needed in an optical system by which an image can be reflected on a large-sized screen of, for instance, a projection television. In such case, the light intensity decreases as the number of times of reflection increases. As a result, there causes the problem that the finally obtainable light intensity decreases so that the luminance of the screen becomes low. Accordingly, a reflection mirror having a higher reflectance than conventional reflection mirror is required.

As the material for the metal film, aluminum has conventionally been used. However, when the aluminum is used as the material for the metal film, there is the problem that the reflectance varies depending on an incident angle of light thereby causing fluctuation of the reflected color.

In order to solve the above-mentioned problem, there is a proposal that silver, having a higher reflectance in the visible-light region than aluminum, is used as the material for the metal film. However, although the silver has a high reflectance in the visible-light region in comparison with aluminum, the silver has drawbacks that durability to a moisture resistance, a saltwater resistance etc. is low; it is easily damaged because the strength of the film is low, and the adhesion of it to the substrate is poor.

As a mirror using an Ag film as the metal film, having a high reflectance and being excellent in durability, a high reflectance mirror formed by depositing on a glass substrate an $Al_2O_3$ film, an Ag film, an $Al_2O_3$ film and a $TiO_2$ film in this order, is disclosed (see for example, JP-A-2003-4919). In this high reflectance mirror, oxygen is introduced when the $Al_2O_3$ film is formed on the Ag film surface on the opposite side of the substrate. Accordingly, there is the problem that the silver is easily oxidized and then to reduce the reflectance.

Further, in order to improve the adhesion between an Ag film and the substrate, a reflecting film in which a metal such as Ce or Nd is mixed in Ag is disclosed (see, for example, JP-A-2002-226927). However, this reflecting film is a single film of silver, and therefore, there is only description about the adhesion between the Ag film and the substrate, and there is no evaluation about the adhesion between the Ag film and the other layer at all.

Further, a reflection mirror wherein an $Al_2O_3$ film, a $ZrO_2$ film and a $SiO_2$ film are formed on an Ag film is disclosed (see, for example, JP-A-5-127004). This publication describes that the $Al_2O_3$ film is a protective film to improve the durability of the Ag film, the $ZrO_2$ film is a film to improve the reflection efficiency and the $SiO_2$ film is a protective film.

Further, the formation of a film of chromium oxide between the substrate and an Ag film in order to improve the adhesion between the substrate and the Ag film, is disclosed (see, for example, JP-A-2000-81505).

Further, there is description that an $Al_2O_3$ film is formed on an Ag film, and a layer of e.g. zirconium oxide, silicon dioxide, titanium oxide, hafnium oxide, tin oxide, antimony oxide, tungsten oxide or the like is formed to improve the durability (see, for example, JP-A-2000-241612).

Further, the formation of an undercoat film of silicon oxide between the substrate and an Ag film to improve the durability, is disclosed (see, for example, JP-A-2001-74922).

However, these reflecting films have the problem that the reflectance in a visible-light region is low.

It is an object of the present invention to provide a high reflectance mirror having a high reflectance in a visible-light region, being excellent in durability such as a moisture resistance, a saltwater resistance, etc. and having small dependence on incident angle (i.e., the fluctuation of the reflectance depending on an incident angle of light is little).

SUMMARY OF THE INVENTION

In accordance with the present invention, there is provided a high reflectance mirror comprising a substrate and a silver film, a low refractive index film and a high refractive index film formed on the substrate in this order wherein an adhesion improving film is formed on the silver film surface on the opposite side of the substrate, the extinction coefficient of the low refractive index film is at most 0.01, the extinction coefficient of the high refractive index film is at most 0.01, the adhesion improving film is an oxide film and the extinction coefficient of the adhesion improving film is at most 0.1.

DETAILED DESCRIPTION OF THE PREFERRED EMBODIMENTS

In the high reflectance mirror of the present invention, the kind of the substrate is not in particular limited. For example, 1) glass such as soda lime glass and 2) a film of a PET (polyethylene terephthalate) resin, an acrylic resin, polycarbonate or the like may be mentioned. Use of the glass is advantageous in that a product having a large surface area without a warpage or a curvature is obtainable. Use of a film is advantageous in that the weight of the product can be reduced. The thickness of the substrate, when it is made of glass, is preferably from 0.5 to 8.0 mm from the viewpoint of the strength of the obtained high reflectance mirror and usability of it. The thickness of the substrate, when it is made of a film, is preferably from 30 to 500 μm from the viewpoint of weight reduction. The shape of the substrate is not in particular restricted as long as it satisfies a shape required for substrates for various types of optical members for reflection mirrors such as a plane mirror, a concave mirror, a convex mirror, a trapezoidal mirror or the like. When a sputtering method is used for the high reflectance mirror of the present invention, a film formed by the sputtering method is excellent in uniformity in comparison with a film formed by using a vapor deposition method. Accordingly, it is possible to form a film on a larger substrate. For example, since it is possible to form a film on a substrate having a large surface area of, for example, from 0.1 to 5 $m^2$, it is useful as an optical member for a large-sized rear-projection television.

The silver film for reflecting light effectively is a film containing silver as the major component, and it preferably contains at least 90 at % of silver from the viewpoint of the reflectance in the visible-light region. By using the silver film, the reflectance in the visible-light region can be increased and the dependence of the reflectance on an incident angle can be reduced. The silver film may contain impurities such as copper and so on. However, the content of the impurities is preferably at most 10 at %. The "visible-light region" in the present invention means a wavelength region of from 400 to 800 nm.

The silver film may be an alloy film containing silver and other metal. As the other metal, Au can be mentioned. By forming an alloy film containing Au, the durability of the silver film can be improved. The content of the other metal in the alloy film is preferably from 0.5 to 10 at % to improve the durability. Further, the content of silver in the alloy film is preferably at least 90 at % from the viewpoint of the reflectance in the visible-light region.

The geometric film thickness (hereinbelow, referred to simply as the film thickness) of the silver film is preferably from 60 to 200 nm, particularly, from 80 to 120 nm. If the thickness is less than 60 nm, the reflectance in the visible-light region decreases. If it exceeds 200 nm, absorption of light takes place due to irregularity on the silver film surface with the result that the reflectance in the visible-light region decreases.

The low refractive index film of the present invention has preferably a refractive index of from 1.35 to 1.75 at a wavelength of 550 nm. Further, the low refractive index film should be a transparent film from the viewpoint of reflectance. Specifically, it is preferred that the extinction coefficient in the visible-light region (hereinbelow, referred to simply as the extinction coefficient) is at most 0.01, more preferably, at most 0.008, particularly preferably, at most 0.005. The material of the low refractive index film is preferably an oxide such as a silicon oxide because of its stability. It is preferred that the film thickness of the low refractive index film is from 25 to 60 nm, particularly, from 28 to 45 nm in order to obtain the optimum reflectance. When a silicon oxide film is used as the low refractive index film, the content of silicon in the silicon oxide film is preferably at least 90 mass % based on all metals and semiconductor elements in the silicon oxide film because a film having a predetermined refractive index can be obtained. The silicon oxide film may contain other metal such as aluminum. Here, the refractive index means a real part in a complex index of refraction, and the extinction coefficient means an imaginary part in the complex index of refraction in the visible-light region, each of which can be measured with a spectroscopic ellipsometer (e.g., VASE manufactured by J.A. Woollam Co.).

The low refractive index film may be of a single layer or plural layers. When it comprises a plurality of layers, it is preferred that each layer has a refractive index of from 1.35 to 1.75 at a wavelength of 550 nm. Each layer in the low refractive index film comprised of a plurality of layers should be transparent, and the extinction coefficients of all layers are preferably at most 0.01, more preferably, at most 0.008, particularly, at most 0.005. Further, the entire thickness of the plurality of layers is preferred to be from 25 to 60 nm, particularly, from 28 to 45 nm because the optimum reflectance can be obtained.

The high refractive index film of the present invention has preferably a refractive index of from 1.8 to 2.8 at a wavelength of 550 nm. Further, the high refractive index film should be a transparent film from the viewpoint of reflectance. Specifically, it is preferred that the extinction coefficient is at most 0.01, more preferably, at most 0.008, particularly preferably, at most 0.005. Further, it is preferred that the material of the high refractive index film is at least one selected from the group consisting of niobium oxide, zirconium oxide, tantalum oxide, hafnium oxide, titanium oxide and tin oxide from the viewpoint of the reflectance. Particularly, the niobium oxide is preferred in the points that the refractive index is high, the absorptance is low and the film forming speed is high. Further, the material of the high refractive index film may be a composite oxide. The film thickness of the high refractive index film is preferably from 30 to 65 nm, more preferably, from 40 to 65 nm because the optimum reflectance can be obtained. When the high refractive index film is a niobium oxide film, the content of niobium in the niobium oxide film is preferably at least 90 mass % based on all metal elements in the niobium oxide film because a film having a predetermined refractive index can be obtained.

The high refractive index film may be of a single layer or plural layers. When it comprises a plurality of layers, it is preferred that each layer has a refractive index of from 1.8 to 2.8 at a wavelength of 550 nm. Each layer in the high refractive index film comprised of a plurality of layers should be transparent, and the extinction coefficients of all layers are preferably at most 0.01, preferably at most 0.008, particularly preferably at most 0.005. Further, the entire thickness of the plurality of layers is preferred to be from 30 to 65 nm, particularly, from 40 to 65 nm because the optimum reflectance can be obtained.

In the present invention, explanation has been made as to the case that the low refractive index film and the high refractive index film are formed once in this order. However, the lamination is not limited to only once but the low refractive index film and the high refractive index film may be laminated more than once in this order. When the lamination is made more than once, a high reflectance mirror having a further improved reflectance can be formed. Further, it is possible to form a layer for improving durability as a layer remotest from the substrate.

In the high reflectance mirror of the present invention, it is preferred to form an undercoat film on the silver film surface on the side of the substrate. By forming the undercoat film, it is possible to increase the adhesion between the silver film and the substrate whereby a high reflectance mirror excellent in durability can be obtained. The material of the undercoat film is preferably at least one selected from the group consisting of oxide, oxynitride and nitride, specifically, at least one selected from the group consisting of zinc oxide, tin oxide, indium oxide, aluminum oxide, titanium oxide, niobium oxide and chromium oxide, from the viewpoint of the adhesion between the substrate and the silver film. Silicon oxide can be used for the undercoat film unless the silicon oxide film is made in contact with the silver film because the silicon oxide has poor adhesive properties to silver. Further, a composite oxide may be used as the material of the undercoat film. The film thickness of the undercoat film is preferably from 1 to 20 nm, more preferably, 2 to 10 nm, particularly preferably, from 3 to 7 nm. If it is less than 1 nm, it is difficult to improve the adhesion. If it exceeds 20 nm, irregularities of the undercoat film layer becomes large and the reflectance is reduced. Further, the undercoat film may be of a single layer or plural layers. When it comprises a plurality of layers, it is preferred that the total film thickness is in the above-mentioned range.

When the undercoat film is a zinc oxide film, the content of zinc in the zinc oxide film is preferred to be at least 90 mass % based on the all metal elements in the zinc oxide film. The zinc oxide film may contain other metal whereby the adhesion between the substrate and the silver film can be improved. As the other metal, aluminum, gallium, tin, titanium, silicon or the like may be mentioned, and the content of it or them is preferably from 2 to 10 mass % in oxide conversion, because the adhesion between the substrate and the silver film can be improved.

In the high reflectance mirror of the present invention, an adhesion improving film is formed on the silver film surface on the opposite side of the substrate. The presence of the adhesion improving film prevents the silver film from being oxidized, improves the moisture resistance of the high reflectance mirror and improves the adhesion between the low refractive index film and the silver film. The adhesion improving film should be a transparent film from the viewpoints of reflectance. The extinction coefficient of this film is at most 0.1, preferably, at most 0.05, particularly preferably, at most 0.02. The material of the adhesion improving film is preferably oxide having an extinction coefficient of at most 0.1, specifically, at least one selected from the group consisting of zinc oxide, tin oxide, indium oxide, aluminum oxide and titanium oxide, from the viewpoint of the adhesion between the substrate and the silver film. Silicon oxide can be used for the adhesion improving film unless the silicon oxide film is made in contact with the silver film because the silicon oxide has poor adhesive properties to silver. Further, a composite oxide may be used as the material of the adhesion improving film. The film thickness of the adhesion improving film is preferably from 3 to 14 nm, more preferably, from 4 to 12 nm, further preferably, from 4 to 6 nm. If it is less than 3 nm, it is difficult to improve the adhesion and to provide an antioxidation effect. On the other hand, if it exceeds 14 nm, irregularity on the surface of the film becomes large and the reflectance is therefore reduced. The adhesion improving film may be of a single layer or plural layers. When it comprises a plurality of layers, the total film thickness is preferably in the above-mentioned range.

When the adhesion improving film is a zinc oxide film, the content of zinc in the zinc oxide film is preferred to be at least 90 mass % based on all metal elements in the zinc oxide film. The zinc oxide film may contain other metal whereby the adhesion between the substrate and the silver film can be improved. As the other metal, at least one selected from the group consisting of gallium, tin, silicon and titanium can specifically be mentioned, and the content of it or them is preferably from 3 to 10 mass % in oxide conversion, from the viewpoint of stress relaxation. Use of aluminum as the other metal is not preferred because of absorption in the visible-light region.

When the adhesion improving film is a zinc oxide film containing at least one selected from the group consisting of gallium, tin and titanium (hereinbelow, referred to as the GSTZO film), it may contain silicon in addition thereto. Due to the presence of silicon, reduction of the film does not easily takes place, and the film having stable optical characteristics can be formed. The content of silicon in the GSTZO film is preferably from 0.1 to 1 mass % based on all metal elements in the GSTZO film.

Further, an antioxidation film may be formed on the adhesion improving film surface on the opposite side of the substrate. The formation of the antioxidation film can prevent effectively the silver film from being oxidized and can increase the reflectance. It is preferred that the antioxidation film has an extinction coefficient of at most 0.01, particularly, at most 0.001 from the viewpoints of reflectance and adhesion. Further, it is preferred that oxidation takes place at only the surface and there is no diffusion of oxygen to the inside. In addition, it is preferred that the refractive index after the oxidation is smaller than 1.8 from the viewpoint that the reflectance does not decrease. In consideration of the above-mentioned points, the material of the antioxidation film is preferably at least one selected from the group consisting of aluminum oxide, aluminum nitride and silicon nitride. The antioxidation film may be of a single layer or plural layers. Further, aluminum may be doped with a metal such as Mg, Si, Zr or the like.

When the adhesion improving layer is formed as a slightly absorptive film (e.g., a GSTZO film), the reflectance of the high reflectance mirror is reduced slightly due to the absorption in the adhesion improving film although it provides a sufficient adhesion to the silver film. Accordingly, when the adhesion improving film is formed to have a smaller film thickness (for example, a thickness from 1.5 to 3.0 nm) and an antioxidation film of little absorbability is formed thereon, the reflectance can further be improved.

When the antioxidation film is an aluminum oxide film, the aluminum oxide film may be formed by a method that for example, an aluminum film is first formed, and then, the aluminum film is oxidized by oxygen existing in a vessel used when an upper film is formed thereon. This method is preferred because the aluminum film can be formed in an oxygen-gas-free atmosphere whereby the silver film can be prevented from being oxidized. In addition, an excellent adhesion can be maintained even after the formation of the aluminum oxide film. The film thickness of the aluminum oxide film is preferably from 0.5 to 6 nm.

When the antioxidation film is an aluminum nitride film, the aluminum nitride film may be formed by a method that for example, an aluminum film is formed in a vessel containing nitrogen. The film thickness of the aluminum nitride film is preferably from 0.5 to 10 nm.

In particular, when a GSTZO film is used as the adhesion improving film and an aluminum oxide film is used as the antioxidation film, both effects of improving the durability and improving the reflectance can preferably be achieved.

As described above, in the high reflectance mirror of the present invention, a multilayer structure comprising the silver film, the low refractive index film and the high refractive index film is formed on a surface of the substrate. However, such multilayer structure may be provided on both surfaces of the substrate. Further, the structure of the multilayer film on the both surfaces may be the same or different.

In the high reflectance mirror of the present invention, the minimum value of the reflectance of the mirror with respect to light in the entire visible-light region, incoming to its film surface in contact with air (hereinbelow, referred to as the reflectance at the film surface) is preferably at least 85%, more preferably at least 88% when the incident angle of the light is in a range of from 0 to 75°. Specifically, the minimum value of the reflectance at the film surface in the entire visible-light region is preferably at least 85%, more preferably, at least 88% at incident angles of 15°, 45° and 75° respectively. Further, the maximum value of the reflectance at the film surface in the entire visible-light region is preferably at least 95% when the incident angle is in a range of from 0 to 75°. Specifically, the maximum value of the reflectance at the film surface in the entire visible-light region is preferably at least 95.5%, at least 95.5% and at least 95%, particularly preferably, at least 96.5%, at least 96.5% and at least 96% at incident angles of 15°, 45° and 75° respectively. The high reflectance mirror of the present invention can take high values in the reflectance at the film surface as described above, without depending on incident angles. Accordingly, it is possible to reflect an image without causing the reduction of luminance even when light is repeatedly reflected in an electronic appliance such as a rear-projection television or a liquid crystal display device. Here, the incident angle means the angle with respect to a line perpendicular to the film surface.

The high reflectance mirror of the present invention can be produced by a sputtering method using a target of a metal or a metal oxide.

In the following, a method for producing a high reflectance mirror having such a construction that an undercoat film, a silver film, an adhesion improving film, a low refractive index film and a high refractive index are formed on the substrate in this order, will be described. First, on the substrate, 1) the undercoat film is formed by a reactive sputtering method using a metal target; 2) on the undercoat film, the silver film is formed by a sputtering method using a target of silver or a silver alloy; 3) on the silver film, the adhesion improving film is formed by a sputtering method using a target of a metal oxide; 4) on the adhesion improving film, the low refractive index film is formed by a reactive sputtering method using a target of metal, and 5) on the low refractive index film, the high refractive index film is formed by a reactive sputtering method using a target of metal. When the adhesion improving film is formed in 3), it is preferable to form the adhesion improving film in an atmosphere where an oxidation gas such as oxygen does not exist. In the -formation of the adhesion improving film, the content of the oxidation gas in the sputtering gas is preferably at most 10 vol %.

Figure 1:
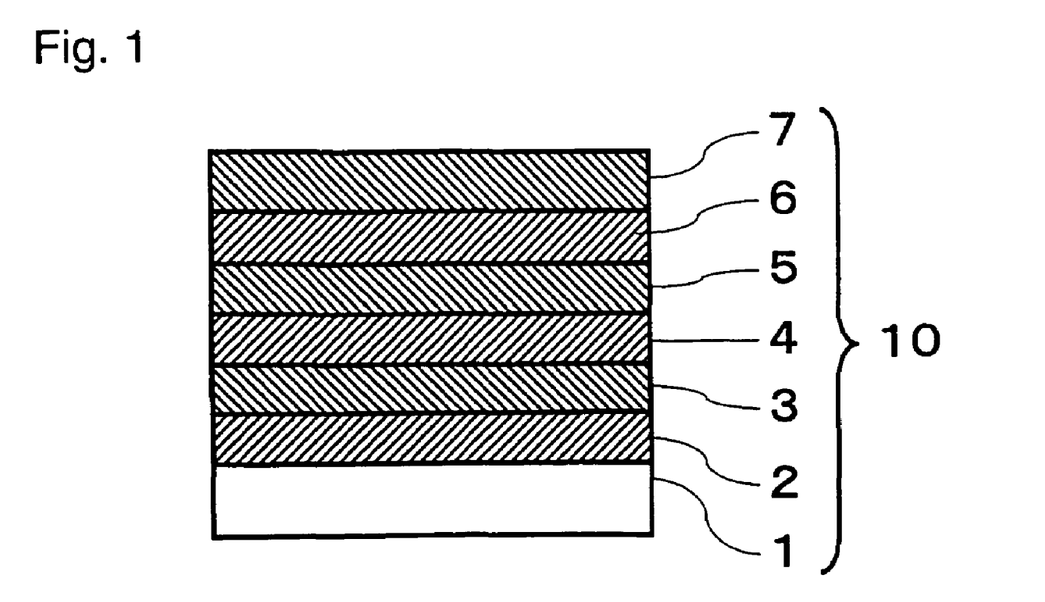
FIG. 1 is a cross-sectional view of the high reflectance mirror according to the present invention.

As shown in FIG. 1, a high reflectance mirror 10 according to the present invention has a structure that an undercoat film 2, a silver film 3, an adhesion improving film 4, an antioxidation film 5, a low refractive index film 6 and a high refractive index film 7 are formed on a substrate 1 in this order.

As the sputtering method, an alternate current (AC) or a direct current (DC) sputtering method may be used. The DC sputtering method includes a pulsed DC sputtering method. The AC sputtering method or the pulsed DC sputtering method is effective from the viewpoint of preventing an abnormal discharge. In order to form a dense film, the AC sputtering method or a DC reactive sputtering method is effective. These sputtering methods are excellent in that a film can be formed on a large-sized substrate and that the deviation of the film thickness on the substrate is small, in comparison with a vapor deposition method.

The high reflectance mirror product of the present invention is effective as a reflecting member for a light source for a display device or the like used for a flat panel display, a rear-projection television, a cellular phone and so on.

EXAMPLE

Now the high reflectance mirror of the present invention will be described in detail with reference to Examples (Examples 1 to 5, 10 to 12 and 14 to 16) and Comparative Examples (Examples 6 to 8, 13 and 17) as well as an Example (Example 9) of the film. However, it should be understood that the present invention is by no means restricted by such specific Examples.

Example 1

A cleaned soda lime glass plate (100 mm×100 mm×2 mm thick) as a substrate was placed in a vacuum vessel. As targets, a target made of zinc oxide added with aluminum (the content of aluminum oxide: 3 mass %, the content of zinc oxide: 97 mass %), a target made of a silver alloy added with Au (the content of Au: 2 at %, the content of silver: 98 at %), a target made of zinc oxide added with gallium (the content of gallium oxide: 5.7 mass %, the content of zinc oxide: 94.3 mass %), a target made of silicon metal (a boron-doped polycrystal target, the content of silicon: 99.999 mass %) and a target made of niobium metal (the content of niobium: 99.9 mass %) were respectively placed on respective cathodes at positions opposing the substrate, and the vacuum vessel was evacuated to $2 \times 10^{-3}$ Pa. The size of the surface of each target was 177.8 mm×381 mm. Then, the films of the below-mentioned A) to E) were formed sequentially to obtain a high reflectance mirror.

A) Formation of an Undercoat Film (a Zinc Oxide Film)

An argon gas as a sputtering gas was fed into the vacuum vessel at a rate of 300 sccm, and a DC sputtering method was carried out using a target made of zinc oxide added with aluminum under an input power of 1 kW to form on the glass substrate an aluminum-doped zinc oxide film in a film thickness of 5 nm. The composition of the aluminum-doped zinc oxide film was nearly the same as the composition of the target.

B) Formation of a Silver Alloy Film

After evacuating the remained gas, an argon gas as a sputtering gas was fed into the vacuum vessel at a rate of 300 sccm, and a DC sputtering method was carried out using a target made of a silver alloy added with Au under an input power of 1 kW to form a silver film in a film thickness of 100 nm on the undercoat film. The composition of the silver alloy film was nearly the same as that of the target.

C) Formation of an Adhesion Improving Film (a Zinc Oxide Film)

After evacuating the remained gas, an argon gas as a sputtering gas was fed into the vacuum vessel at a rate of 300 sccm, and a DC sputtering method was carried out using a target made of zinc oxide added with gallium under an input power of 1 kW to form a gallium-doped zinc oxide film on the silver alloy film (the refractive index at a wavelength of 550 nm: 1.99, the extinction coefficient: 0.017) in a film thickness of 1.0 nm. The composition of the gallium-doped zinc oxide film was nearly the same as that of the target.

D) Formation of a Low Refractive Index Film (a Silicon Oxide Film)

After evacuating the remained gas, an oxygen gas as a sputtering gas was fed into the vacuum vessel at a rate of 450 sccm, and an AC sputtering method was carried out using a target made of silicon metal under an input power of 2 kW to from on the adhesion improving film a silicon oxide film (the refractive index at a wavelength of 550 nm: 1.46, the extinction coefficient: 0) in a film thickness of 30 nm.

E) Formation of a High Refractive Index Film (a Niobium Oxide Film)

After evacuating the remained gas, an oxygen gas as a sputtering gas was fed into the vacuum vessel at 450 sccm, and a DC sputtering method was carried out using a target of niobium metal under an input power of 2 kW to form on the low refractive index film a niobium oxide film (the refractive index at a wavelength of 550 nm: 2.30, the extinction coefficient: 0) in a film thickness of 43 nm.

The durability of the produced high reflectance mirror was evaluated according to the following methods. The results of (1) to (4) are shown in Table 1, and the result of (5) is shown in Table 2.

(1) Moisture Resistance Test Under High Temperature

The produced high reflectance mirror was cut into 50 mm square to use it as a sample. The sample was left in an atmosphere of a temperature of 50° C. and a relative humidity of 95% for 24 hours. Then, the presence or absence of the peeling-off and corrosion of film was observed. ○ indicated that neither the peeling-off nor corrosion of film was found. X indicated that the peeling-off and/or the corrosion of film was found.

(2) Salt Water Test

The produced high reflectance mirror was cut into 50 mm square to use it as a sample. The sample was immersed in salt water containing 5 mass % of sodium chloride. Then, the presence or absence of the peeling-off and corrosion of film after the immersion was observed. ○ indicated that neither peeling-off nor corrosion of film was found. X indicated that peeling-off and/or corrosion of film was found.

(3) Tape Peeling Test

An adhesive tape No. 610 (manufactured by Sumitomo 3M Co.) was attached strongly to the film surface of the produced high reflectance mirror with a manual force. The presence or absence of the peeling-off of the film after the adhesive tape was peeled off quickly, was observed. ○ indicated that no peeling-off of film was found. X indicated that the peeling-off of film was found.

(4) Cheese Cloth

The film surface of the produced high reflectance mirror was rubbed strongly 20 times with gauze I (manufactured by Nippon Yakkyoku) with a manual force. Then, the presence or absence of the peeling-off or damage of film after the rubbing was observed. ○ indicated that neither peeling-off nor damage of film was found. X indicated that the peeling off and/or damage of film was found.

(5) Reflectance at the Film Surface.

The reflectance at the film surface of the produced high reflectance mirror was measured with a spectrophotometer ART-25GT (manufactured by JASCO Co., LTD.) at each of incident angles of 15°, 45° and 75°. Then, minimum values and maximum values in the entire visible-light region were evaluated. Here, the incident angle means an angle with respect to a line perpendicular to the film surface.

Example 2

A high reflectance mirror is produced in the same manner as Example 1 except that an oxygen gas is fed as a sputtering gas into a vacuum vessel at 450 sccm, and an AC reactive sputtering method is carried out using a target made of zirconium metal (the content of zirconium: 99.9 mass %) under an input power of 2 kW to form a zirconium oxide film (the refractive index at a wavelength of 550 nm: 2.11, the extinction coefficient: 0) as a high refractive index film in a film thickness of 47 nm, instead of forming the niobium oxide film as the high refractive index film in Example 1.

The produced high refractive index film is evaluated in the same ways as Example 1. The results of (1) to (4) are shown in Table 1, and the result of (5) is shown in Table 2.

Example 3

A high reflectance mirror is produced in the same manner as Example 1 except that an oxygen gas is fed as a sputtering gas into a vacuum vessel at a rate of 450 sccm, and an AC reactive sputtering method is carried out using a target made of tantalum metal (the content of tantalum: 99.99 mass %) under an input power of 2 kW to form a tantalum oxide film (the refractive index at a wavelength of 550 nm: 2.03, the extinction coefficient: 0) as a high refractive index film, in a film thickness of 49 nm, instead of forming the niobium oxide film as the high refractive index film in Example 1.

The produced high reflectance mirror is evaluated in the same ways as Example 1. The results of (1) to (4) are shown in Table 1, and the result of (5) is shown in Table 2.

Example 4

A high reflectance mirror is produced in the same manner as Example 1 except that an oxygen gas is fed as a sputtering gas into a vacuum vessel at a rate of 450 sccm, and an AC reactive sputtering method is carried out using a target made of titanium metal (the content of titanium: 99.99 mass %) under an input power of 2 kW to form a titanium oxide film (the refractive index at a wavelength of 550 nm: 2.4, the extinction coefficient: 0.003) as a high refractive index film, in a film thickness of 33 nm, instead of forming the niobium oxide film as the high refractive index film in Example 1.

The produced high reflectance mirror is evaluated in the same ways as Example 1. The results of (1) to (4) are shown in Table 1, and the result of (5) is shown in Table 2.

Example 5

A high reflectance mirror is produced in the same manner as Example 1 except that an oxygen gas is fed as a sputtering gas into a vacuum vessel at a rate of 450 sccm, and an AC reactive sputtering method is carried out using a target made of hafnium metal (the content of hafnium: 98 mass %) under an input power of 2 kW to form a hafnium oxide film (the refractive index at a wavelength of 550 nm: 2.07, the extinction coefficient: 0) as a high refractive index film, in a film thickness of 50 nm, instead of forming the niobium oxide film as the high refractive index film in Example 1.

The produced high reflectance mirror is evaluated in the same ways as Example 1. The results of (1) to (4) are shown in Table 1, and the result of (5) is shown in Table 2.

Example 6 (Comparative Example)

A high reflectance mirror was produced in the same manner as Example 1 except that argon and nitrogen gases were fed as sputtering gases into a vacuum vessel at rates of 210 sccm and 90 sccm respectively, and an AC reactive sputtering method was carried out using a target made of silicon metal (the content of silicon: 99.999 mass %) under an input power of 2 kW to form a silicon nitride film (the refractive index at a wavelength of 550 nm: 2.03, the extinction coefficient: 0) as an adhesion improving film, in a film thickness of 5 nm, instead of forming the gallium-doped zinc oxide film as the adhesion improving film in Example 1.

The produced high reflectance mirror was evaluated in the same ways as Example 1. The results of (1) to (4) are shown in Table 1, and the result of (5) is shown in Table 2.

Example 7 (Comparative Example)

A high reflectance mirror was produced in the same manner as Example 1 except that an argon gas was fed as a sputtering gas into a vacuum vessel at a rate of 300 sccm, and an AC reactive sputtering method was carried out using a target made of zinc oxide added with aluminum (the content of aluminum oxide: 3 mass %, the content of zinc oxide: 97 mass %) under an input power of 1 kW to form an aluminum-doped zinc oxide film (the refractive index at a wavelength of 550 nm: 2.02, the extinction coefficient: 0.2) as an adhesion improving film, in a film thickness of 5 nm, instead of forming the gallium-doped zinc oxide film as the adhesion improving film in Example 1.

The produced high reflectance mirror was evaluated in the same ways as Example 1. The results of (1) to (4) are shown in Table 1, and the result of (5) is shown in Table 2.

Example 8 (Comparative Example: Aluminum Reflection Mirror)

An argon gas was fed as a sputtering gas into a vacuum vessel at a rate of 300 sccm, and a DC sputtering method was carried out using an aluminum target (purity: 99.9999 mass %) under an input power of 1 kW to form on a glass substrate an aluminum film in a thickness of 80 nm.

Then, an oxygen gas was fed as a sputtering gas into the vacuum vessel at a rate of 450 sccm, and an AC sputtering method was carried out using a target of silicon metal (a boron-doped polycrystal target, the content of silicon: 99.999 mass %) under an input power of 2 kW to form on the aluminum film a silicon oxide film (the refractive index at a wavelength of 550 nm: 1.46, the extinction coefficient: 0) in a film thickness of 80 nm.

Then, an oxygen gas was fed as a sputtering gas into the vacuum vessel at a rate of 450 sccm, and a DC reactive sputtering method was carried out using a target of niobium metal (the content of niobium: 99.9 mass %) under an input power of 2 kW to form on the silicon oxide film a niobium oxide film (the refractive index at a wavelength of 550 nm: 2.30, the extinction coefficient: 0) in a film thickness of 57 nm, whereby a high reflectance mirror was obtained.

The produced high reflectance mirror was evaluated in the same ways as Example 1. The results of (1) to (4) are shown in Table 1, and the result of (5) is shown in Table 2.

Example 9 (PET Film)

As a substrate, a PET substrate (a roll of 100 mm×30 m×50 μm thick) was place in a vacuum vessel. Before deposition, argon and oxygen were fed into the vacuum vessel at rates of 80 sccm and 20 sccm respectively, and electric discharge was caused under an input power of 0.3 kW to clean the PET substrate. As targets, a target made of zinc oxide added with gallium (the content of gallium oxide: 5.7 mass %, the content of zinc oxide: 94.3 mass %), a target of a silver alloy added with Au (the content of Au: 2 at %, the content of silver: 98 at %), a target of silicon metal (a boron-doped polycrystal target, the content of silicon: 99.999 mass %) and a target made of niobium oxide were respectively placed on respective cathodes at positions opposing the substrate, and the vacuum vessel was evacuated to $2\times10^{-3}$ Pa. The size of the surface of each target was 177.8 mm×381 mm. Then, the films of the below-mentioned A) to E) were formed sequentially to obtain a high reflectance mirror.

A) Formation of an Undercoat Film (a Zinc Oxide Film)

An argon gas as a sputtering gas was fed into a vacuum vessel at a rate of 80 sccm, and a DC sputtering method was carried out using a target made of zinc oxide added with gallium under an input power of 0.3 kW to form on the PET substrate a gallium-doped zinc oxide film in a film thickness of 5 nm. The composition of the gallium-doped zinc oxide film was nearly the same as that of the target.

B) Formation of a Silver Alloy Film

After evacuating the remained gas, an argon gas was fed as a sputtering gas into the vacuum vessel at a rate of 80 sccm, and a DC sputtering method was carried out using a target made of a silver alloy added with Au under an input power of 0.3 kW to form on the undercoat film a silver alloy film in a thickness of 100 nm. The composition of the silver alloy film was nearly the same as that of the target.

C) Formation of an Antioxidation Film (a Zinc Oxide Film)

After evacuating the remained gas, an argon gas as a sputtering gas was fed into the vacuum vessel at 80 sccm, and a DC sputtering method was carried out using a target made of zinc oxide added with gallium under an input power of 0.3 kW to form on the silver alloy film a gallium-doped zinc oxide film (the refractive index at a wavelength of 550 nm: 1.99, the extinction coefficient: 0.017) in a film thickness of 10 nm. The composition of the gallium-doped zinc oxide film was nearly the same as that of the target.

D) Formation of a Low Refractive Index Film (a Silicon Oxide Film)

After evacuating the remained gas, an oxygen gas and an argon gas as sputtering gases were fed into the vacuum vessel at a rate of 50 sccm and 50 sccm respectively, and an AC sputtering method was carried out using a target made of silicon metal under an input power of 0.5 kW to form on the antioxidation film a silicon oxide film (the refractive index at a wavelength of 550 nm: 1.46, the extinction coefficient: 0) in a film thickness of 30 nm.

E) Formation of a High Refractive Index Film (a Niobium Oxide Film)

After evacuating the remained gases, an oxygen gas and an argon gas as sputtering gases were fed into the vacuum vessel at a rate of 3 sccm and 97 sccm respectively, and a DC sputtering method was carried out using a target made of niobium oxide under an input power of 0.5 kW to form on the low refractive index film a niobium oxide film (the refractive index at a wavelength of 550 nm: 2.30, the extinction coefficient: 0) in a film thickness of 43 nm.

The produced high reflectance mirror was evaluated in the same ways as Example 1. The results of (1) to (4) are shown in Table 1, and the result of (5) is shown in Table 2.

Example 10

A high reflectance mirror is produced in the same manner as Example 1 except that an oxygen gas as a sputtering gas is fed into a vacuum vessel at a rate of 450 sccm, and an AC reactive sputtering method is carried out using a target made of niobium metal (the content of niobium: 99.9 mass %) under an input power of 2 kW to form a niobium oxide film as a undercoat film in a film thickness of 5 nm, instead of forming the aluminum-doped zinc oxide film as the undercoat film in Example 1.

The produced high reflectance mirror is evaluated in the same ways as Example 1. The results of (1) to (4) are shown in Table 1, and the result of (5) is shown in Table 2.

Example 11

A high reflectance mirror is produced in the same manner as Example 1 except that an oxygen gas as a sputtering gas is fed into a vacuum vessel at a rate of 450 sccm, and an AC reactive sputtering method is carried out using a target of titanium metal (the content of titanium: 99.99 mass %) under an input power of 2 kW to form a titanium oxide film as an undercoat film in a film thickness of 5 nm, instead of forming the aluminum-doped zinc oxide film as the undercoat film in Example 1.

The produced high reflectance mirror is evaluated in the same ways as Example 1. The results of (1) to (4) are shown in Table 1, and the result of (5) is shown in Table 2.

Example 12

A high reflectance mirror is produced in the same manner as Example 1 except that an oxygen gas as a sputtering gas is fed into a vacuum vessel at a rate of 450 sccm, and an AC reactive sputtering method is carried out using a target made of tin metal (the content of tin: 99.9 mass %) under an input power of 1 kW to form a tin oxide film as an undercoat film in a film thickness of 5 nm, instead of forming the aluminum-doped zinc oxide film as the undercoat film in Example 1.

The produced high reflectance mirror is evaluated in the same ways as Example 1. The results of (1) to (4) are shown in Table 1, and the result of (5) is shown in Table 2.

Example 13

A high reflectance mirror is produced in the same manner as Example 1 except that an oxygen gas as a sputtering gas is fed into a vacuum vessel at a rate of 450 sccm, and an AC reactive sputtering method is carried out by using a target made of silicon metal (the content of silicon: 99.99 mass %) under an input power of 2 kW to form a silicon oxide film as an undercoat film in a film thickness of 5 nm, instead of forming the aluminum-doped zinc oxide film as the undercoat film in Example 1.

The produced high reflectance mirror is evaluated in the same ways as Example 1. The results of (1) to (4) are shown in Table 1, and the result of (5) is shown in Table 2.

Example 14

A high reflectance mirror is produced in the same manner as Example 1 except that an argon gas as a sputtering gas is fed into a vacuum vessel at a rate of 300 sccm, and a DC reactive sputtering method is carried out using a target made of zinc oxide doped with gallium and silicon under an input power of 1 kW to form a gallium/silicon-doped zinc oxide film (the refractive index at a wavelength of 550 nm: 1.99, the extinction coefficient: 0.017) as an adhesion improving film in a film thickness of 5 nm, instead of forming the gallium-doped zinc oxide film as the adhesion improving film in Example 1.

The produced high reflectance mirror is evaluated in the same ways as Example 1. The results of (1) to (4) are shown in Table 1, and the result of (5) is shown in Table 2.

Example 15

A cleaned soda lime glass plate (100 mm×100 mm×2 mm thick) as a substrate was placed in a vacuum vessel. As targets, a target made of zinc oxide added with aluminum (the content of aluminum oxide: 3 mass %, the content of zinc oxide: 97 mass %), a target made of a silver alloy added with Au (the content of Au: 2 at %, the content of silver: 98 at %), a target made of zinc oxide added with gallium and silicon (the content of gallium oxide: 5.7 mass %, the content of silicon oxide: 0.1%, the content of zinc oxide: 94.2 mass %), a target made of silicon metal (a boron-doped polycrystal target, the content of silicon: 99.999 mass %), a target of niobium metal (the content of niobium: 99.9 mass %) and a target made of an aluminum alloy (the content of aluminum: 99.99 mass %) were respectively placed on respective cathodes at positions opposing the substrate, and the vacuum vessel was evacuated to $2\times10^{-3}$ Pa. The size of the surface of each target was 177.8 mm×381 mm. Then, the films of the below-mentioned A) to E) were formed sequentially to obtain a high reflectance mirror.

A) Formation of an Undercoat Film (a Zinc Oxide Film)

An argon gas as a sputtering gas was fed into the vacuum vessel at a rate of 300 sccm, and a DC sputtering method was carried out using a target made of zinc oxide added with aluminum to form on the glass substrate an aluminum-doped zinc oxide film in a thickness of 5 nm. The composition of the aluminum-doped zinc oxide film was nearly the same as that of the target.

B) Formation of a Silver Alloy Film

After evacuating the remained gas, an argon gas as a sputtering gas was fed into the vacuum vessel at a rate of 300 sccm, and a DC sputtering method was carried out using a target of a silver alloy added with gold under an input power of 1 kW to form on the undercoat film a silver alloy film in a film thickness of 100 nm. The composition of the silver alloy film was nearly the same as that of the target.

C) Formation of an Adhesion Improving Film (a Zinc Oxide Film)

After evacuating the remained gas, an argon gas as a sputtering gas was fed into the vacuum vessel at a rate of 300 sccm, and a DC sputtering method was carried out using a target made of zinc oxide added with gallium and silicon under an input power of 1 kW to form on the silver alloy film a gallium-doped zinc oxide film (the refractive index at a wavelength of 550 nm: 1.99, the extinction coefficient: 0.017) in a film thickness of 1.5 nm. The composition of the gallium-doped zinc oxide film was nearly the same as that of the target.

D) Formation of an Antioxidation Film (an Aluminum Alloy Film)

After evacuating the remained gas, an argon gas as a sputtering gas was fed into the vacuum vessel at a rate of 300 sccm, and a DC sputtering method was carried out using a target made of an aluminum alloy under an input power of 0.3 kW to form on the adhesion improving film an aluminum alloy film in a film thickness of 1 nm. The component of the aluminum alloy film was nearly the same as that of the target.

E) Formation of a Low Refractive Index Film (a Silicon Oxide Film)

After evacuating the remained gas, an oxygen gas as a sputtering gas was fed into the vacuum vessel at a rate of 450 sccm, and an AC sputtering method was carried out using a target made of silicon metal under an input power of 2 kW to from on the antioxidation film a silicon oxide film (the refractive index at a wavelength of 550 nm: 1.46, the extinction coefficient: 0) in a film thickness of 30 nm.

F) Formation of a High Refractive Index Film (a Niobium Oxide Film)

After evacuating the remained gas, an oxygen gas as a sputtering gas was fed into the vacuum vessel at a rate of 450 sccm, and a DC sputtering method was carried out using a target of niobium metal under an input power of 2 kW to form on the low refractive index film a niobium oxide film (the refractive index at a wavelength of 550 nm: 2.30, the extinction coefficient: 0) in a film thickness of 43 nm.

It was confirmed that the aluminum alloy film formed in D) became an aluminum alloy oxide film (the refractive index at a wavelength of 550 nm: 1.77, the extinction coefficient: 0) by being oxidized in the duration of forming the silicon oxide film in E).

Example 16

A high reflectance mirror was produced in the same manner as Example 15 except that an argon gas and a nitrogen gas as sputtering gases were fed into a vacuum vessel at 200 sccm and 200 sccm respectively, and an AC reactive sputtering method was carried out using a target made of an aluminum alloy under an input power of 0.5 kW to from an aluminum nitride film (the refractive index at a wavelength of 550 nm: 1.93, the extinction coefficient: 0) as an adhesion improving film in a thickness of 1 nm, instead of forming the aluminum alloy film as the antioxidation film in Example 15.

The produced high reflectance mirror was evaluated in the same ways as Example 1. The results of (1) to (4) are shown in Table 1, and the result of (5) is shown in Table 2.

Example 17 (Comparative Example)

A high reflectance mirror is produced in the same manner as Example 1 except that an aluminum oxide film (the refractive index at a wavelength of 550 nm: 1.7, the extinction coefficient: 0) as a low refractive index film is formed in a film thickness of 69 nm by feeding an oxygen gas as a sputtering gas into a vacuum vessel at a rate of 450 sccm and carrying out an AC reactive sputtering method using a target of aluminum metal (the content of aluminum: 99.99 mass %) under an input power of 2 kW, instead of forming the silicon oxide film as the low refractive index film in Example 1; that a zirconium oxide film (the refractive index at a wavelength of 550 nm: 2.11, the extinction coefficient: 0) as a high refractive index film is formed in a film thickness of 57 nm by feeding an oxygen gas as a sputtering gas into the vacuum vessel at a rate of 450 sccm and carrying out an AC reactive sputtering method using a target of zirconium metal (the content of zirconium: 99.99 mass %) under an input power of 2 kW, instead of forming the niobium oxide film as the high refractive index film in Example 1, and that a silicon oxide film (the refractive index at a wavelength of 550 nm: 1.46, the extinction coefficient: 0) as a protective film is formed on the zirconium oxide film in a film thickness of 20 nm by feeding an oxygen gas as a sputtering gas into the vacuum vessel at a rate of 450 sccm and carrying out an AC sputtering method using a target of silicon metal under an input power of 2 kW.

The produced high reflectance mirror is evaluated in the same ways as Example 1. The results of (1) to (4) are shown in Table 1, and the result of (5) is shown in Table 2.

Table 3 shows the film structure obtained by each Example.

TABLE 1

|  | Moisture resistance test under high temperature | Salt water test | Tape peeling test | Cheese cloth test |
|---|---|---|---|---|
| Example 1 | ○ | ○ | ○ | ○ |
| Example 2 | ○ | ○ | ○ | ○ |
| Example 3 | ○ | ○ | ○ | ○ |
| Example 4 | ○ | ○ | ○ | ○ |
| Example 5 | ○ | ○ | ○ | ○ |
| Example 6 | X | X | X | ○ |
| Example 7 | ○ | ○ | ○ | ○ |
| Example 8 | ○ | ○ | ○ | ○ |
| Example 9 | ○ | ○ | ○ | X |
| Example 10 | ○ | ○ | ○ | ○ |
| Example 11 | ○ | ○ | ○ | ○ |
| Example 12 | ○ | ○ | ○ | ○ |
| Example 13 | X | X | X | ○ |
| Example 14 | ○ | ○ | ○ | ○ |
| Example 15 | ○ | ○ | ○ | ○ |
| Example 16 | ○ | ○ | ○ | ○ |
| Example 17 | ○ | ○ | ○ | ○ |

TABLE 2

|  | Minimum value | | | Maximum value | | |
|---|---|---|---|---|---|---|
|  | 15° | 45° | 75° | 15° | 45° | 75° |
| Example 1 | 94.5 | 94.0 | 86.0 | 97.5 | 97.0 | 97.0 |
| Example 2 | 93.5 | 93.5 | 87.5 | 97.0 | 96.5 | 97.0 |
| Example 3 | 93.0 | 93.0 | 87.5 | 97.0 | 96.5 | 97.0 |
| Example 4 | 94.0 | 93.0 | 89.0 | 97.0 | 97.0 | 97.0 |
| Example 5 | 93.0 | 93.0 | 87.0 | 97.0 | 96.5 | 97.0 |
| Example 6 | 94.5 | 94.0 | 91.0 | 98.0 | 97.5 | 98.0 |
| Example 7 | 91.5 | 90.0 | 90.0 | 94.5 | 92.5 | 94.0 |
| Example 8 | 83.5 | 80.0 | 81.0 | 95.5 | 94.5 | 90.0 |
| Example 9 | 94.5 | 94.0 | 86.0 | 97.5 | 97.0 | 97.0 |
| Example 10 | 94.5 | 94.0 | 86.0 | 97.5 | 97.0 | 97.0 |
| Example 11 | 94.5 | 94.0 | 86.0 | 97.5 | 97.0 | 97.0 |
| Example 12 | 94.5 | 94.0 | 86.0 | 97.5 | 97.0 | 97.0 |
| Example 13 | 94.5 | 94.0 | 86.0 | 97.5 | 97.0 | 97.0 |
| Example 14 | 94.5 | 94.0 | 86.0 | 97.5 | 97.0 | 97.0 |
| Example 15 | 94.8 | 94.5 | 91.9 | 97.4 | 97.3 | 97.0 |
| Example 16 | 94.8 | 94.5 | 91.9 | 97.4 | 97.3 | 97.0 |
| Example 17 | 73.8 | 81.9 | 94.5 | 98.4 | 98.2 | 97.9 |

TABLE 3

|  | Film structure |
|---|---|
| Example 1 | G/AZO/AgAu/GZO/SiO$_2$/Nb$_2$O$_5$ |
| Example 2 | G/AZO/AgAu/GZO/SiO$_2$/ZrO$_2$ |
| Example 3 | G/AZO/AgAu/GZO/SiO$_2$/Ta$_2$O$_5$ |
| Example 4 | G/AZO/AgAu/GZO/SiO$_2$/TiO$_2$ |
| Example 5 | G/AZO/AgAu/GZO/SiO$_2$/Hf$_2$O$_5$ |
| Example 6 | G/AZO/AgAu/SiN/SiO$_2$/Nb$_2$O$_5$ |
| Example 7 | G/AZO/AgAu/AZO/SiO$_2$/Nb$_2$O$_5$ |
| Example 8 | G/Al/SiO$_2$/Nb$_2$O$_5$ |
| Example 9 | F/AZO/AgAu/GZO/SiO$_2$/Nb$_2$O$_5$ |
| Example 10 | G/Nb$_2$O$_5$/AgAu/GZO/SiO$_2$/Nb$_2$O$_5$ |
| Example 11 | G/TiO$_2$/AgAu/GZO/SiO$_2$/Nb$_2$O$_5$ |
| Example 12 | G/SnO$_2$/AgAu/GZO/SiO$_2$/Nb$_2$O$_5$ |
| Example 13 | G/SiO$_2$/AgAu/GZO/SiO$_2$/Nb$_2$O$_5$ |
| Example 14 | G/SiO$_2$/AgAu/(Ga + Si)ZO/SiO$_2$/Nb$_2$O$_5$ |
| Example 15 | G/AZO/AgAu/(Ga + Si)ZO/Al$_2$O$_3$/SiO$_2$/Nb$_2$O$_5$ |
| Example 16 | G/AZO/AgAu/(Ga + Si)ZO/AlN/SiO$_2$/Nb$_2$O$_5$ |
| Example 17 | G/AZO/Ag/Al$_2$O$_3$/ZrO$_2$/SiO$_2$ |

In the high reflectance mirrors in Examples 1 to 5, silver is used as the reflecting material and the low refractive index film and the high refractive index film are laminated on it. Accordingly, the minimum value of the reflectance at the film surface is high as at least 85% over the entire visible-light region; the maximum values of them are high as at least 96%, and the dependence on the incident angle of the maximum value is small as at most 2%, in particular, at most 1%. Further, since the undercoat film and the adhesion improving film are formed, the high reflectance mirrors provide excellent durability such as moisture resistance.

On the other hand, since the silicon nitride film which is not an oxide film is used as the adhesion improving film in Example 6, the adhesion is not sufficient, and delamination of the silver film is observed after the tape peeling-off test. Further, in Example 7, the zinc oxide film doped with aluminum is used as the adhesion improving film wherein the extinction coefficient is large as 0.2. Accordingly, the maximum value of the reflectance at its film surface decreases to about 92%, hence, being undesirable. In Example 8, since the aluminum film is used as the reflecting film, the minimum value of the reflectance at its film surface decreases to about 81%, hence, being undesirable.

In Example 9, since the film is used as the substrate, the result of the cheese cloth test is poor. However, it provides an excellent durability, and accordingly, it has a sufficient durability when used as a backlight module for a small-sized liquid crystal display device. Further, the minimum value of the reflectance at its film surface is high as at least 85% in the entire visible-light region; the maximum value is also high as at least 96%, and the dependence on the incident angle at the maximum value is small as at most 1%.

In the high reflectance mirrors in Examples 10 to 12, since the undercoat films are formed with niobium oxide, titanium oxide and tin oxide, the adhesion to the silver film can be improved and excellent durability such as moisture resistance can be provided.

In Example 13, however, since the silicon oxide film having a composition close to the glass substrate is used as the undercoat film, the adhesion is insufficient and the peeling off of the silver film is found such being undesirable. In Example 14, the gallium/silicon-doped zinc oxide film is formed as the adhesion improving film. Accordingly, a high reflectance mirror having an improved adhesion to the silver film, an excellent durability such as moisture resistance and high reflectance can be provided.

Further, in the high reflectance mirrors in Example 15 or 16, since an adhesion improving layer having a slight absorptivity is formed to be thin and an antioxidation layer having little absorption is laminated thereon, they provide excellent optical properties and excellent durability such as moisture resistance due to the presence of the undercoat film and the adhesion improving film. Further, the minimum value of the reflectance at its film surface is high as at least 91.9% in the entire visible-light region, the maximum value of it is high as at least 97% and the dependence on the incident angle at the maximum value is small as at most 0.5%.

Further, in the high reflectance mirror in Example 17, the minimum value of the reflectance at its film surface is low as 73.8% in the entire visible-light region, hence, being undesirable.

According to the high reflectance mirror of the present invention, the reflectance in the visible-light region can be increased since silver is used as the material of the reflecting film. Further, since it has an excellent durability, it is useful as an optical part for a display device and it can improve the luminance of the display device and facilitates the designing of optical parts. Further, the high reflectance mirror of the present invention has a smaller dependence on an incident angle. Accordingly, it is useful as an optical part for a rear-projection television requiring a more number of times of reflection of light. Further, since the high reflectance mirror of the present invention assures a high reflectance without depending on the incident angle of light, it is useful as in particular, the mirror in a backlight module for a liquid crystal display device.

The entire disclosures of Japanese Patent Application No. 2003-184718 filed on Jun. 27, 2003 and Japanese Patent Application No. 2003-399390 filed on Nov. 28, 2003 including specifications, claims, drawings and summaries are incorporated herein by reference in their entireties.

What is claimed is:

1. A high reflectance mirror comprising a substrate and a silver film, a low refractive index film and a high refractive index film formed on the substrate in this order wherein an adhesion improving film is formed on the silver film surface on the opposite side of the substrate, the extinction coefficient of the low refractive index film is at most 0.01, the extinction coefficient of the high refractive index film is at most 0.01, the adhesion improving film is an oxide film and the extinction coefficient of the adhesion improving film is at most 0.1;

wherein the geometric film thickness of the silver film is from 60 to 200 nm, the geometric film thickness of the low refractive index film is from 25 to 60 nm, the geometric film thickness of the high refractive index film is from 30 to 65 nm and the geometric film thickness of the adhesion improving film is from 3 to 14 nm;

wherein the silver film is an alloy film of silver and gold;

wherein an undercoat film is formed on the silver film surface on the side of the substrate, the geometric film thickness of the undercoat film is from 1 to 20 nm, and the material of the undercoat film is at least one selected from the group consisting of zinc oxide, tin oxide, indium oxide, aluminum oxide, titanium oxide, niobium oxide and chromium oxide;

wherein the material of the adhesion improving film is at least one selected from the group consisting of zinc oxide, tin oxide, indium oxide and aluminum oxide; and wherein the material of the low refractive index film is silicon oxide;

wherein the material of the high refractive index film is at least one selected from the group consisting of niobium oxide, zirconium oxide, tantalum oxide, hafnium oxide, titanium oxide and tin oxide.

2. A high reflectance mirror comprising a substrate and a silver film, a low refractive index film and a high refractive index film formed on the substrate in this order wherein an adhesion improving film is formed on the silver film surface on the opposite side of the substrate, the extinction coefficient of the low refractive index film is at most 0.01, the extinction coefficient of the high refractive index film is at most 0.01, the adhesion improving film is an oxide film and the extinction coefficient of the adhesion improving film is at most 0.1;

wherein the geometric film thickness of the silver film is from 60 to 200 nm, the geometric film thickness of the low refractive index film is from 25 to 60 nm, the geometric film thickness of the high refractive index film is from 30 to 65 nm and the geometric film thickness of the adhesion improving film is from 3 to 14 nm;

wherein the silver film is an alloy film of silver and gold;

wherein an undercoat film is formed on the silver film surface on the side of the substrate, the geometric film thickness of the undercoat film is from 1 to 20 nm, and the material of the undercoat film is at least one selected from the group consisting of zinc oxide, tin oxide, indium oxide, aluminum oxide, titanium oxide, niobium oxide and chromium oxide;
wherein the adhesion improving film is a zinc oxide film that includes gallium oxide;
wherein the content of the gallium oxide is from 3 to 10 mass % in oxide conversion in the zinc oxide film of the adhesion improving film,
wherein the material of the low refractive index film is silicon oxide; and
wherein the material of the high refractive index film is at least one selected from the group consisting of niobium oxide, zirconium oxide, tantalum oxide, hafnium oxide, titanium oxide and tin oxide.

3. A high reflectance mirror comprising a substrate and a silver film, a low refractive index film and a high refractive index film formed on the substrate in this order wherein an adhesion improving film is formed on the silver film surface on the opposite side of the substrate, the extinction coefficient of the low refractive index film is at most 0.01, the extinction coefficient of the high refractive index film is at most 0.01, the adhesion improving film is an oxide film and the extinction coefficient of the adhesion improving film is at most 0.1;
wherein the geometric film thickness of the silver film is from 60 to 200 nm, the geometric film thickness of the low refractive index film is from 25 to 60 nm, the geometric film thickness of the high refractive index film is from 30 to 65 nm and the geometric film thickness of the adhesion improving film is from 3 to 14 nm;
wherein the silver film is an alloy film of silver and gold;
wherein an undercoat film is formed on the silver film surface on the side of the substrate, the geometric film thickness of the undercoat film is from 1 to 20 nm, and the material of the undercoat film is at least one selected from the group consisting of zinc oxide, tin oxide, indium oxide, aluminum oxide, titanium oxide, niobium oxide and chromium oxide;
wherein the adhesion improving film is a zinc oxide film, and the zinc oxide film includes titanium oxide;
wherein the content of the titanium oxide is from 3 to 10 mass % in oxide conversion in the zinc oxide film of the adhesion improving film;
wherein the material of the low refractive index film is silicon oxide; and
wherein the material of the high refractive index film is at least one selected from the group consisting of niobium oxide, zirconium oxide, tantalum oxide, hafnium oxide, titanium oxide and tin oxide.

4. A high reflectance mirror comprising a substrate and a silver film, an adhesion improving film, a low refractive index film and a high refractive index film formed on the substrate in this order wherein an antioxidation film is formed on the adhesion improving film surface on the opposite side of the substrate, the extinction coefficient of the low refractive index film is at most 0.01, the extinction coefficient of the high refractive index film is at most 0.01, the adhesion improving film is an oxide film and the extinction coefficient of the adhesion improving film is at most 0.1;
wherein the geometric film thickness of the silver film is from 60 to 200 nm, the geometric film thickness of the low refractive index film is from 25 to 60 nm, the geometric film thickness of the high refractive index film is from 30 to 65 nm and the geometric film thickness of the adhesion improving film is from 1.5 to 3 nm;
wherein the silver film is an alloy film of silver and gold;
wherein an undercoat film is formed on the silver film surface on the side of the substrate, the geometric film thickness of the undercoat film is from 1 to 20 nm, and the material of the undercoat film is at least one selected from the group consisting of zinc oxide, tin oxide, indium oxide, aluminum oxide, titanium oxide, niobium oxide and chromium oxide;
wherein the material of the low refractive index film is silicon oxide;
wherein the material of the high refractive index film is at least one selected from the group consisting of niobium oxide, zirconium oxide, tantalum oxide, hafnium oxide, titanium oxide and tin oxide;
wherein the adhesion improving film is a zinc oxide film, and the zinc oxide film includes gallium oxide;
wherein the content of the gallium oxide is from 3 to 10 mass % in oxide conversion in the zinc oxide film of the adhesion improving film; and
wherein the material of the anti-oxidation film is at least one selected from the group consisting of aluminum oxide, aluminum nitride and silicon nitride.

5. A high reflectance mirror comprising a substrate and a silver film, an adhesion improving film, a low refractive index film and a high refractive index film formed on the substrate in this order wherein an antioxidation film is formed on the adhesion improving film surface on the opposite side of the substrate, the extinction coefficient of the low refractive index film is at most 0.01, the extinction coefficient of the high refractive index film is at most 0.01, the adhesion improving film is an oxide film and the extinction coefficient of the adhesion improving film is at most 0.1;
wherein the geometric film thickness of the silver film is from 60 to 200 nm, the geometric film thickness of the low refractive index film is from 25 to 60 nm, the geometric film thickness of the high refractive index film is from 30 to 65 nm and the geometric film thickness of the adhesion improving film is from 1.5 to 3 nm;
wherein the silver film is an alloy film of silver and gold;
wherein an undercoat film is formed on the silver film surface on the side of the substrate, the geometric film thickness of the undercoat film is from 1 to 20 nm, and the material of the undercoat film is at least one selected from the group consisting of zinc oxide, tin oxide, indium oxide, aluminum oxide, titanium oxide, niobium oxide and chromium oxide;
wherein the material of the low refractive index film is silicon oxide;
wherein the material of the high refractive index film is at least one selected from the group consisting of niobium oxide, zirconium oxide, tantalum oxide, hafnium oxide, titanium oxide and tin oxide;
wherein the adhesion improving film is a zinc oxide film, and the zinc oxide film includes titanium oxide;
wherein the content of the titanium oxide is from 3 to 10 mass % in oxide conversion in the zinc oxide film of the adhesion improving film; and
wherein the material of the anti-oxidation film is at least one selected from the group consisting of aluminum oxide, aluminum nitride and silicon nitride.

6. The high reflectance mirror according to any one of claims 1, 2, 3, 4 or 5 inclusive, wherein the minimum value of the reflectance of the mirror with respect to light in the entire visible-light region, incoming to its film surface in contact with air is at least 85% when the incident angle of the light is in a range of from 15 to 75°, and
the dependence on the incidence angle of the maximum value is at most 2%.

* * * * *